(12) United States Patent
Hwang

(10) Patent No.: US 11,837,445 B2
(45) Date of Patent: Dec. 5, 2023

(54) SUBSTRATE PROCESSING DEVICE AND SUBSTRATE PROCESSING METHOD

(71) Applicant: JUSUNG ENGINEERING CO., LTD., Gwangju-si (KR)

(72) Inventor: Chul-Joo Hwang, Gwangju-si (KR)

(73) Assignee: JUSUNG ENGINEERING CO., LTD.

( * ) Notice: Subject to any disclaimer, the term of this patent is extended or adjusted under 35 U.S.C. 154(b) by 0 days.

(21) Appl. No.: 17/284,438

(22) PCT Filed: Nov. 14, 2019

(86) PCT No.: PCT/KR2019/015498
§ 371 (c)(1),
(2) Date: Apr. 9, 2021

(87) PCT Pub. No.: WO2020/101375
PCT Pub. Date: May 22, 2020

(65) Prior Publication Data
US 2021/0358719 A1   Nov. 18, 2021

(30) Foreign Application Priority Data

Nov. 14, 2018  (KR) .................. 10-2018-0140181
Feb. 11, 2019  (KR) .................. 10-2019-0015756
Jul. 2, 2019   (KR) .................. 10-2019-0079103

(51) Int. Cl.
*H01J 37/32* (2006.01)
*C23C 16/455* (2006.01)
(Continued)

(52) U.S. Cl.
CPC .. *H01J 37/32449* (2013.01); *C23C 16/45536* (2013.01); *C23C 16/45551* (2013.01);
(Continued)

(58) Field of Classification Search
CPC ....... H01J 37/32449; H01J 2237/20214; H01J 2237/332; H01J 2237/3321;
(Continued)

(56) References Cited

U.S. PATENT DOCUMENTS 6,869,641 B2 *  3/2005  Schmitt ............ C23C 16/45525
                                                           427/248.1
6,972,055 B2 * 12/2005  Sferlazzo .......... C23C 16/45508
                                                           156/345.31
(Continued)

FOREIGN PATENT DOCUMENTS

JP   2002367982 A   12/2002
KR   20110024558 A   3/2011
(Continued)

*Primary Examiner* — Rudy Zervigon
(74) *Attorney, Agent, or Firm* — Renaissance IP Law Group LLP

(57) ABSTRACT

The present disclosure relates to a substrate processing device and a substrate processing method, the substrate processing device comprising: a chamber; a substrate support part installed in a processing space inside the chamber so as to enable one or more substrate to rotate; a first gas spraying part for spraying a source gas on a first area of the processing space; a second gas spraying part for spraying, on a second area of the processing space, a reactant gas reacting with the source gas on the second area; and a third gas spraying part for spraying, on a third area, a purge gas for dividing the first area and the second area.

18 Claims, 11 Drawing Sheets

(51) Int. Cl.
*C23C 16/52* (2006.01)
*H01L 21/02* (2006.01)

(52) U.S. Cl.
CPC ........ *C23C 16/45574* (2013.01); *C23C 16/52* (2013.01); *H01L 21/0228* (2013.01); *H01L 21/02274* (2013.01); *H01J 2237/20214* (2013.01); *H01J 2237/332* (2013.01); *H01J 2237/3321* (2013.01)

(58) Field of Classification Search
CPC ......... H01J 37/32174; C23C 16/45536; C23C 16/45551; C23C 16/45574; C23C 16/52; C23C 16/45538; C23C 16/45525; H01L 21/02274; H01L 21/0228; H01L 21/67017; H01L 21/68764; H05H 1/46
USPC ........... 118/723 R, 719; 156/345.43, 345.44, 156/345.45, 345.31, 345.32
See application file for complete search history.

(56) References Cited

U.S. PATENT DOCUMENTS

| | | | | |
|---|---|---|---|---|
| 8,043,432 | B2* | 10/2011 | Dip | C23C 16/45551 118/719 |
| 8,187,679 | B2* | 5/2012 | Dickey | C23C 16/545 427/569 |
| 8,470,718 | B2* | 6/2013 | Lee | H01L 21/02521 438/763 |
| 8,691,669 | B2* | 4/2014 | Lee | C23C 16/45551 438/483 |
| 8,845,857 | B2* | 9/2014 | Ohizumi | H01L 21/67748 156/345.55 |
| 10,246,775 | B2 | 4/2019 | Kato | C23C 16/45544 |
| 10,480,073 | B2* | 11/2019 | Murakawa | C23C 16/45561 |
| 11,174,553 | B2* | 11/2021 | Doering | C23C 16/45574 |
| 11,189,502 | B2* | 11/2021 | Bera | H01L 21/67017 |
| 2004/0052972 | A1* | 3/2004 | Schmitt | C30B 25/02 118/715 |
| 2004/0058293 | A1* | 3/2004 | Nguyen | H01L 21/6719 432/171 |
| 2004/0187784 | A1* | 9/2004 | Sferlazzo | C23C 16/4584 118/719 |
| 2006/0177579 | A1* | 8/2006 | Shin | C23C 16/50 118/723 R |
| 2007/0218702 | A1* | 9/2007 | Shimizu | C23C 16/36 438/758 |
| 2007/0254486 | A1* | 11/2007 | Bera | H01L 21/76802 257/E21.252 |
| 2008/0026162 | A1* | 1/2008 | Dickey | C23C 16/45551 427/595 |
| 2009/0159213 | A1* | 6/2009 | Bera | H01J 37/3244 156/345.34 |
| 2010/0037820 | A1* | 2/2010 | Lee | C23C 16/45551 118/719 |
| 2010/0041213 | A1* | 2/2010 | Lee | C23C 16/45551 118/729 |
| 2010/0186669 | A1* | 7/2010 | Shin | H01L 21/67742 118/719 |
| 2010/0310771 | A1* | 12/2010 | Lee | C01B 21/076 427/255.28 |
| 2011/0212625 | A1* | 9/2011 | Toyoda | C23C 16/4585 438/758 |
| 2012/0094011 | A1* | 4/2012 | Hishiya | C23C 16/40 427/8 |
| 2012/0094149 | A1* | 4/2012 | Lee | C23C 16/403 427/255.28 |
| 2012/0125258 | A1* | 5/2012 | Lee | H01J 37/32752 118/719 |
| 2012/0225194 | A1* | 9/2012 | Yudovsky | C23C 16/54 901/30 |
| 2013/0260539 | A1* | 10/2013 | Lee | C23C 16/45551 438/597 |
| 2014/0027777 | A1* | 1/2014 | Lee | C30B 25/183 117/89 |
| 2014/0087567 | A1 | 3/2014 | Toyoda et al. | |
| 2015/0104574 | A1* | 4/2015 | Lee | C23C 16/45551 427/255.28 |
| 2015/0148557 | A1* | 5/2015 | Lee | C23C 16/452 427/255.394 |
| 2015/0194298 | A1* | 7/2015 | Lei | H01L 21/02194 438/782 |
| 2015/0275365 | A1* | 10/2015 | Pak | C23C 16/4584 427/255.28 |
| 2015/0361550 | A1* | 12/2015 | Yabe | H01L 21/02164 438/782 |
| 2016/0020116 | A1* | 1/2016 | Lee | C23C 16/50 438/798 |
| 2016/0340779 | A1* | 11/2016 | Lee | H01J 37/3244 |
| 2017/0107614 | A1* | 4/2017 | Lee | C23C 16/0272 |
| 2018/0130674 | A1* | 5/2018 | Han | C23C 16/455 |
| 2021/0087684 | A1* | 3/2021 | Sasaki | C23C 16/45551 |
| 2021/0249264 | A1* | 8/2021 | Kato | H01L 21/02488 |
| 2021/0249265 | A1* | 8/2021 | Kato | H01L 21/3065 |

FOREIGN PATENT DOCUMENTS

| | | |
|---|---|---|
| KR | 20140033659 A | 3/2014 |
| KR | 20160128219 A | 11/2016 |
| TW | 201839850 A | 11/2018 |
| WO | 2008100846 A2 | 8/2008 |

* cited by examiner

| Region \ Embodiment | 1 | 2 | 3 | 7 | 8 |
|---|---|---|---|---|---|
| First region | X | X | X | X | X |
| First zone | X | X | O | X | O |
| Second region | X | O | X | X | X |
| Second zone | X | X | X | O | O |

SUBSTRATE PROCESSING DEVICE AND SUBSTRATE PROCESSING METHOD

1. TECHNICAL FIELD

The present disclosure relates to an apparatus for processing a substrate, which performs a processing process such as a deposition process and an etching process on a substrate.

2. BACKGROUND

Generally, a thin-film layer, a thin-film circuit pattern, or an optical pattern should be formed on a substrate for manufacturing a solar cell, a semiconductor device, a flat panel display device, etc. To this end, a processing process is performed, and examples of the processing process include a deposition process of depositing a thin film including a specific material on a substrate, a photo process of selectively exposing a portion of a thin film by using a photosensitive material, an etching process of removing the selectively exposed portion of the thin film to form a pattern, etc.

A process of forming a thin film on a substrate or removing the thin film is performed by supplying the substrate with a gas for forming a specific material, a gas for selectively removing the specific material, or a material corresponding thereto. Particularly, the process of forming the thin film may be performed by supplying a reactant gas and a source gas for forming a specific material, and in this case, the source gas and the reactant gas may be simultaneously supplied to the substrate or may be sequentially supplied to the substrate with a time difference therebetween.

As a semiconductor device manufacturing process advances to a fine process, various methods for forming a uniform thin film on a fine pattern formed on a surface of a substrate or forming a pattern are being applied, and one of the various methods is an atomic layer deposition (ALD) process. The ALD process is a process which does not simultaneously supply a source gas and a reactant gas but supplies the source gas and the reactant gas with a time difference therebetween to induce only a reaction performed on the surface of the substrate, forming a thin film on the substrate through a reaction between the source gas and the reactant gas. The source gas may be adsorbed onto the surface of the substrate by supplying the source gas to the substrate first, and then, the other source gas may be removed by using a purge gas. Subsequently, by supplying the reactant gas to the substrate, the reactant gas may react with the source gas adsorbed onto the surface of the substrate, and then, the other reactant gas may be purged by using the purge gas. In a step of supplying the reactant gas, an atomic layer or a single-layer thin film is formed on the surface of the substrate on the basis of the reaction between the source gas and the reactant gas. Such a procedure may be repeated up to a desired thickness, and thus, a thin film having a certain thickness may be formed on the surface of the substrate.

However, in the ALD process, since the reaction between the source gas and the reactant gas is performed on only the surface of the substrate, there is a disadvantage where a speed at which a thin film is deposited is lower than a general chemical vapor deposition (CVD) process and the like.

Also, a process of quickly repeating a step of supplying the source gas to the same process space, purging the supplied source gas, supplying the reactant gas, and purging the reactant gas has a drawback where a time is long expended. In a case where a process is quickly repeated, the supplied source gas or reactant gas is not completely discharged (purged) from the process space to the outside of a chamber, and due to this, an atomic layer thin film is not formed, causing a drawback where two gases meet each other to form a CVD thin film.

In a process of quickly supplying a source gas or a reactant gas and an ALD process based on the source gas or the reactant gas, a structure where the two gases are not mixed in a process and a pure ALD film are needed.

SUMMARY

The present disclosure is devised to solve the above-described problem by providing a process chamber in which a source gas and a reactant gas are not mixed in a space.

Moreover, the present disclosure solves a technical problem by providing an apparatus for providing a fast process method in forming a thin film through an ALD process.

Moreover, the present disclosure solves a technical problem by providing an apparatus which forms a film (a pure ALD layer) using a pure ALD process on a substrate to densify a certain thin film or improve film quality.

Moreover, the present disclosure solves a technical problem by providing an apparatus which purges a reactant gas remaining on a substrate quickly moving from a reactant gas space to a source gas space and simultaneously supplies plasma to a portion of a purge gas supply unit supplying a purge gas for quickly purging impurities of a generated thin film, in a purge gas space for separating the source gas space and the reactant gas space.

An apparatus for processing a substrate according to the present disclosure for achieving solving the above-described technical problem may include: a chamber; a substrate supporting unit rotatably installed in a process space of the chamber to support one or more substrates; a first gas distribution unit for distributing a source gas to a first region of the process space; a second gas distribution unit for distributing a reactant gas, reacting with the source gas, to a second region of the process space; and a third gas distribution unit for distributing a purge gas, dividing the first region and the second region, to a third region.

A method of processing a substrate according to the present disclosure may include: a step of, when a first substrate is disposed in a first region of a process space of a chamber, distributing a source gas to the first region to perform an adsorption process; a step of, when the adsorption process ends, rotating a substrate supporting unit supporting the first substrate in order for the first substrate to be disposed in a second region of the process space of the chamber; a step of, when the first substrate is disposed in the second region, distributing a reactant gas to the second region to perform a deposition process; and a step of, when the deposition process ends, rotating the substrate supporting unit in order for the first substrate to be disposed in the first region, wherein the step of performing the deposition process may distribute a reactant gas, activated by using plasma, to the second region to perform the deposition process.

According to a solution means for the problem, an apparatus for processing a substrate according to the present disclosure may form a pure ALD thin film through a purge gas distribution space for completely dividing a process space of a chamber into a source gas distribution space and a reactant gas distribution space.

Moreover, the apparatus for processing a substrate according to the present disclosure may purge impurities of a thin film generated on a substrate by using a plasma gas distributed from a third gas distribution unit which is a purge gas distribution space and may completely purge a process gas (i.e., a source gas or a reactant gas) remaining between patterns of the substrate by using a purge gas distributed from the third gas distribution unit.

DETAILED DESCRIPTION

Hereinafter, preferable embodiments according to the present disclosure will be described in detail with reference to the drawings.

Figure 1:
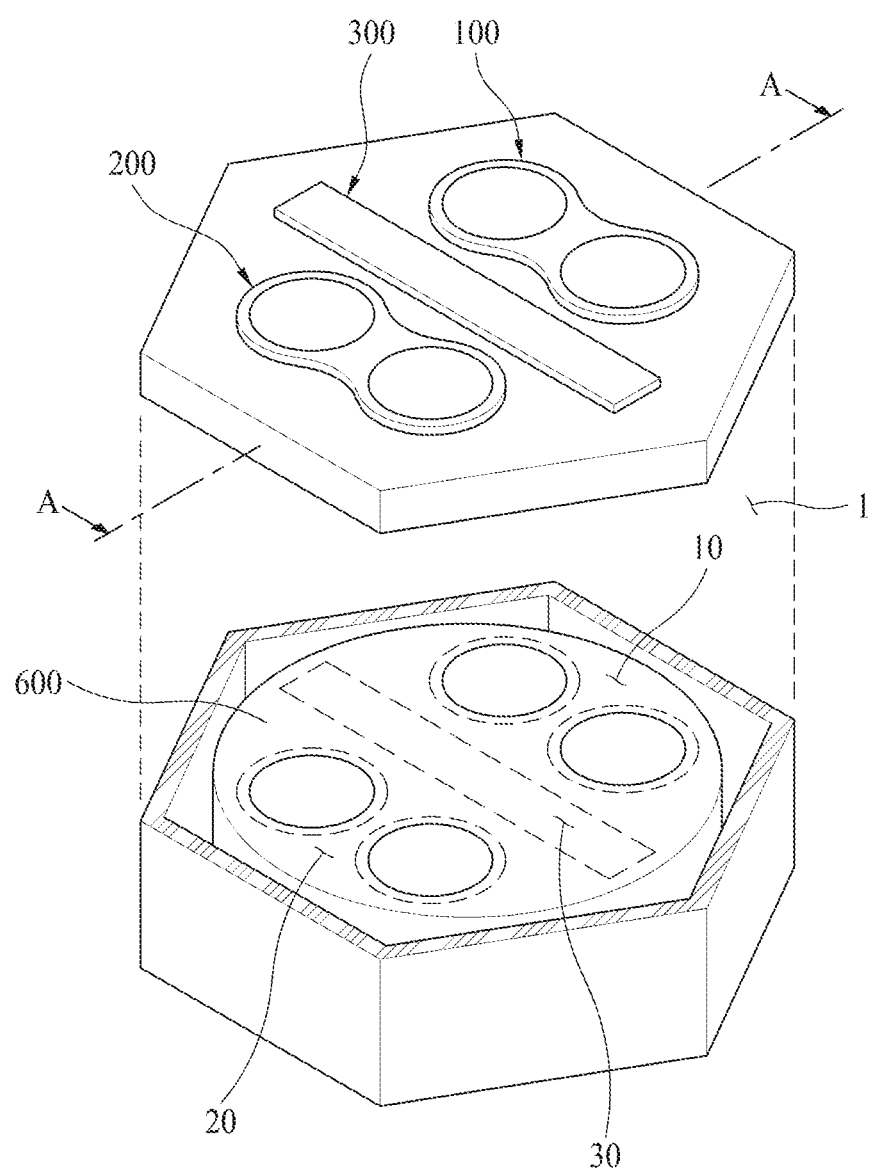
FIG. 1 is a plan view schematically illustrating a shape of an apparatus for processing a substrate according to an embodiment of the present disclosure.
Figure 2:
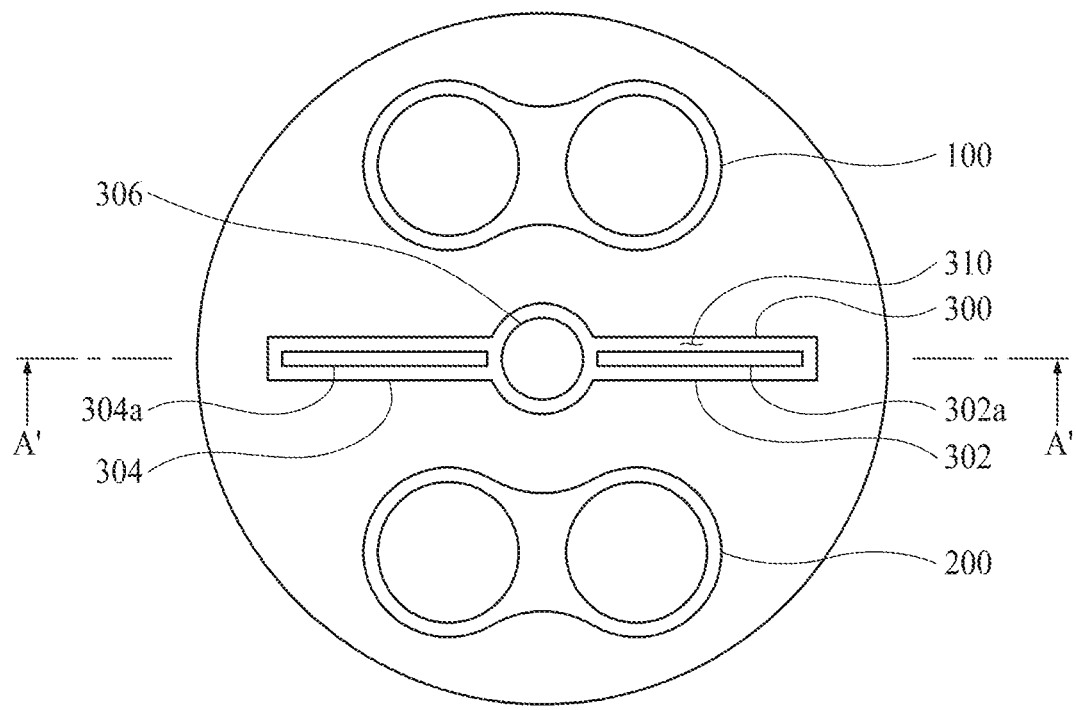
FIG. 2 is a diagram for describing an upper lid of a chamber in an apparatus for processing a substrate according to an embodiment of the present disclosure.

FIG. 1 is a plan view schematically illustrating a shape of a substrate processing apparatus according to an embodiment of the present disclosure. FIG. 2 is a plan view when an upper lid is seen from above in a chamber of which an upper surface is cut.

Referring to FIGS. 1 to 5, in the substrate processing apparatus according to the present disclosure, a process space 1 may be provided in the chamber. An upper lid may be provided in an upper portion of the process space 1 of the chamber, and a substrate supporting unit 600 may be provided in a lower portion of the process space 1 of the chamber. One or more substrates may be disposed on the substrate supporting unit 600.

The process space 1 of the chamber may be divided into a first region 10, a second region 20, and a third region 30. A first gas distribution unit 100 for distributing a source gas to the first region 10 may be disposed in the first region 10. A second gas distribution unit 200 for distributing a reactant gas reacting with the source gas to the second region 20 may be disposed in the second region 20. The first gas distribution unit 100 and the second gas distribution unit 200 may be coupled to the upper lid.

The third region 30 which divides the process space 1 of the chamber into the first region 10 and the second region 20 may be provided. The third region 30 may divide the process space 1 of the chamber into the first region 10 and the second region 20 so that the source gas which is a process gas in the first region 10 is not mixed with the reactant gas which is a process gas in the second region 20. A third gas distribution unit 300 distributing a purge gas may be disposed in the third region 30. The third gas distribution unit 300 may be coupled to the upper lid.

Figure 3A:
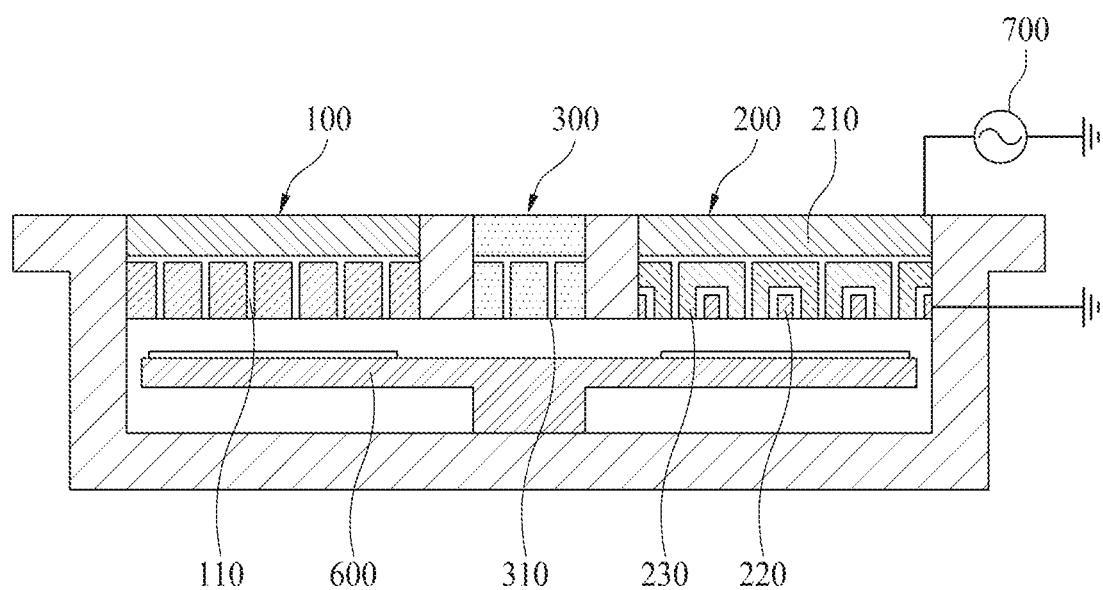
FIGS. 3A and 3B are schematic side cross-sectional views taken along line A-A of FIG. 1 for describing an upper lid of a chamber in an apparatus for processing a substrate according to an embodiment of the present disclosure.
Figure 3B:
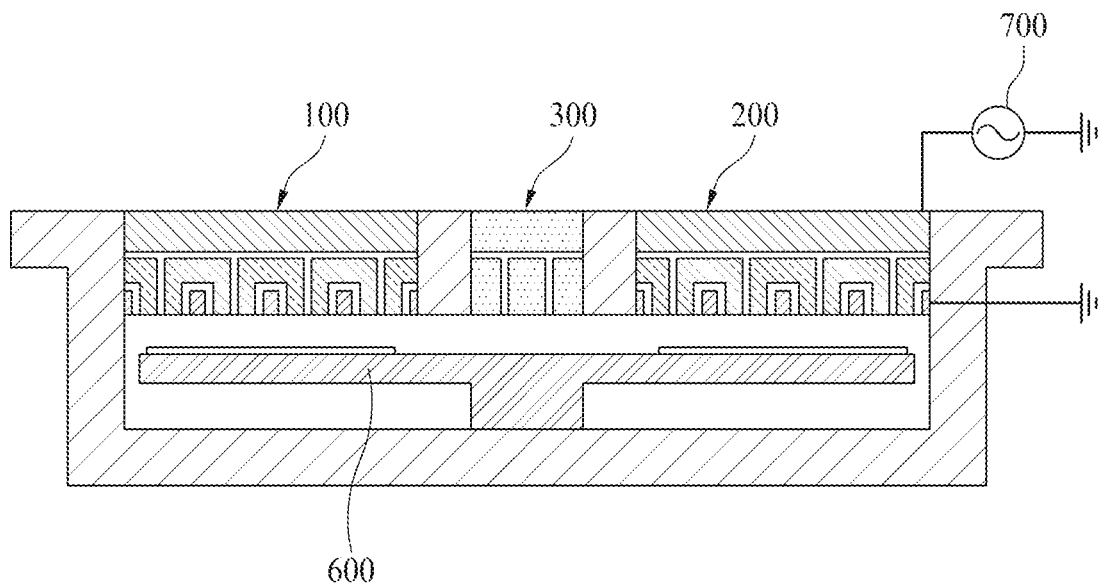

Views taken along line A-A in the chamber of FIG. 1 may be FIGS. 3A and 3B. The second gas distribution unit 200 distributing the reactant gas, as illustrated in FIG. 3A, may be implemented as an electrode structure type configured with a first electrode 210 and a second electrode 220. The second gas distribution unit 200 distributing the reactant gas may be implemented as a showerhead type. In this case, the second gas distribution unit 200 may not include the first electrode 210 and the second electrode 220. For example, the second gas distribution unit 200 distributing the reactant gas may be implemented as the showerhead type like the first gas distribution unit 100 illustrated in FIG. 3A.

In an embodiment, when a radio frequency (RF) power 700 is applied to the first electrode 210, a ground may be connected to the second electrode 220. On the other hand, when the ground is connected to the first electrode 210, the RF power may be applied to the second electrode 220. In all of two cases, when a plasma gas is supplied, plasma may be generated between the first electrode 210 and the second electrode 220. In this case, the first electrode 210 and the second electrode 220 having an electric potential difference therebetween may configure a plasma distribution unit. Also, one or more protrusion electrodes 230 may be formed in a direction toward the substrate supporting unit 600 in the first electrode 210. Accordingly, plasma may be generated in the second region 20.

The second gas distribution unit 200 may be connected to a remote plasma device (not shown) outside the chamber. Therefore, the second gas distribution unit 200 may distribute an ionized gas or a radical to the second region 20.

When the second gas distribution unit 200 is implemented as the electrode structure type, the first electrode 210 and the protrusion electrode 230 may be connected to each other to have the same electric potential. Therefore, due to an electric potential difference, plasma may be generated between the first electrode 210 and the protrusion electrode 230 and between the first electrode 210 and the protrusion electrode 230. In this case, plasma may be generated between the first electrode 210 and the second electrode 220. Plasma may also be generated between the protrusion electrode 230 and the second electrode 220. Plasma may be generated between the first electrode 210 and the second electrode 220 and between the protrusion electrode 230 and the second electrode 220.

A gas distribution hole (not shown) of the second gas distribution unit 200 may be provided as a gas line in the protrusion electrode 230 in a lengthwise direction. In this case, a reactant gas or a plasma generating gas may be distributed through the gas distribution hole provided in the protrusion electrode 230. A gas distribution hole may be provided in a direction toward the process space in the first electrode 210. In this case, a reactant gas or a plasma generating gas may be distributed through the gas distribution hole provided in the first electrode 210.

The second gas distribution unit 200 may include a plasma distribution unit (not shown) which distributes an ionized gas or a radical. The plasma distribution unit may be connected to the remote plasma device (not shown) so as to distribute the ionized gas or the radical.

The first gas distribution unit 100 and the second gas distribution unit 200 may be implemented as different types of distribution structures. For example, the first gas distribution unit 100 may be implemented as the showerhead type, and the second gas distribution unit 200 may be implemented as the electrode structure type. In this case, a process of adsorbing a source gas onto a substrate may be performed in the first region 10, and a process of depositing a thin film using an ALD process on the substrate on the basis of a reaction between a reactant gas and the source gas adsorbed onto the substrate may be performed in the second region 20.

Moreover, the first gas distribution unit 100 may be coupled to the upper lid so as to be disposed in an upper portion of the first region 10. The first gas distribution unit 100 may supply the source gas to the first region 10. The first gas distribution unit 100 may be implemented as the showerhead type. In this case, a first gas distribution hole 110 for distributing the source gas to a portion (i.e., the first region 10) under the first gas distribution unit 100 may be provided in a downward direction of the process space 1. The first gas distribution hole 110 may be provided as a plurality of holes and may distribute the source gas in a direction toward the substrate supporting unit 600. The first gas distribution unit 100 may be implemented as the electrode structure type as illustrated in FIG. 3B. In this case, the first gas distribution unit 100 may include the first electrode 120, the protrusion electrode 130, and the second electrode 140.

The first gas distribution unit 100 and the second gas distribution unit 200 may be implemented in a distribution structure of the same type. In this case, as illustrated in FIG. 3B, the first gas distribution unit 100 and the second gas distribution unit 200 may be all implemented as the electrode structure type. Although not shown, the first gas distribution unit 100 and the second gas distribution unit 200 may be all implemented as the showerhead type.

Referring to FIGS. 1 to 4, the third region 30 may be separated and divided into the first region 10 and the second region 20. When a center portion of the upper lid is cut along line A'-A' with reference to FIG. 2, a side cross-sectional view of FIG. 4 may be seen.

Figure 4:
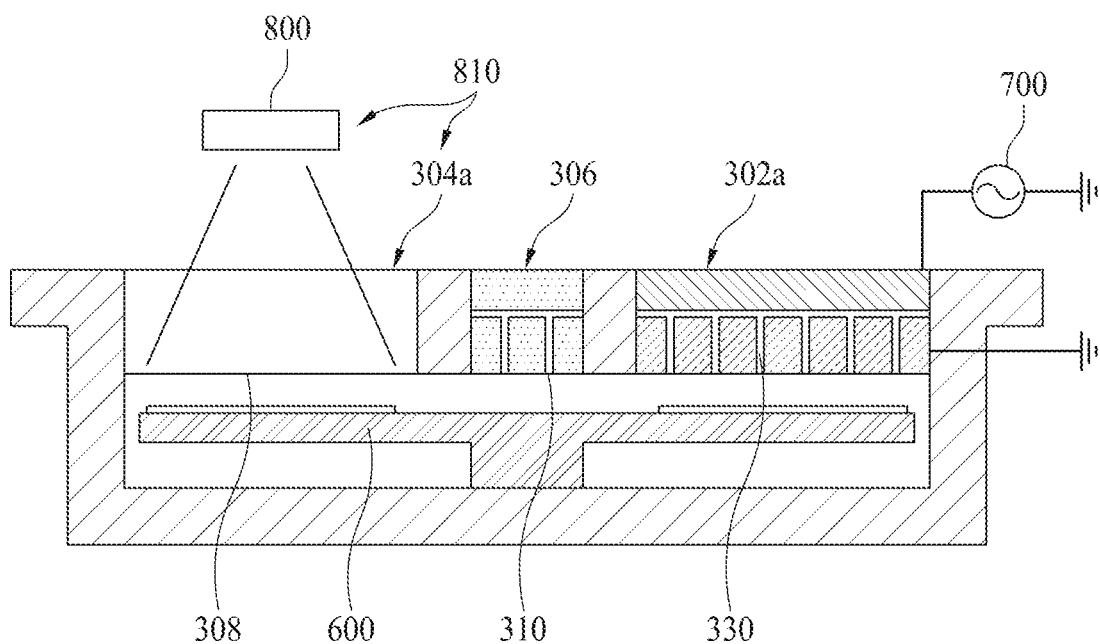
FIG. 4 is a schematic side cross-sectional view taken along line A'-A' of FIG. 2 for describing an upper lid of a chamber in an apparatus for processing a substrate according to an embodiment of the present disclosure.

Referring to FIGS. 2 and 4, the third gas distribution unit 300 distributes a purge gas to the third region 30. The third gas distribution unit 300 may distribute the purge gas to the third region 30 divided into a first zone 302, a second zone 304, and a third zone 306.

A first purge gas distribution unit 310 and a first plasma distribution unit 302a may be disposed in the first zone 302. The RF power 700 for generating plasma may be connected to the first plasma distribution unit 302a. The RF power may be a high frequency power.

The first plasma distribution unit 302a may be disposed inward from the first purge gas distribution unit 310 in the first zone 302. That is, the first purge gas distribution unit 310 may be disposed next to both sides of the first plasma distribution unit 302a.

The first purge gas distribution unit 310 in the first zone 302 may distribute the purge gas to the first zone 302 to purge the source gas of the first region 10 and the reactant gas of the second region 20 so as to be separated from each other.

The first plasma distribution unit 302a in the first zone 302 may distribute the plasma gas to the first zone 302 to perform plasma treatment in a process where the substrate passes through the first zone 302 on the basis of a rotation of the substrate supporting unit 600. Therefore, the first plasma distribution unit 302a in the first zone 302 may remove internal impurities of a thin film on the substrate to enhance the quality of the thin film. Also, when the substrate rotates after a deposition process ends, the plasma treatment may be performed simultaneously while purging a process gas remaining on the substrate in the third region 30, thereby maximally shortening a process time. In a structure as seen from a lower surface of the third gas distribution unit 300, the first purge gas distribution unit 310, the first plasma distribution unit 302a, and the first purge gas distribution unit 310 may be continuously provided.

In the third gas distribution unit 300, the second zone 304 may be provided in a space opposite to the first zone 302. A window 304a may be provided in the second zone 304. The window 304a may be a window which is formed of a transparent material in order for a substrate sensing device 800 to sense and measure a temperature, a position, and a rotation of the substrate at the outside.

The substrate sensing device 800 may sense and measure a distance from the substrate to a lower surface 308 of the third gas distribution unit. The substrate sensing device 800 may include a vision apparatus and a temperature detector which measures a temperature of the substrate.

The temperature detector which measures a temperature of the substrate may be disposed in the second zone 304. The temperature detector may be installed in the third gas distribution unit 300. Also, a second plasma distribution unit may be disposed in the second zone 304.

The window 304a may be disposed in the first zone 302. The first plasma distribution unit 302a and a second plasma distribution unit may be additionally installed in the first zone 302 and the second zone 304, respectively. Also, the window 304a may be installed in each of the first zone 302 and the second zone 304.

Referring to FIG. 4, the third gas distribution unit 300 may include a center purge distribution unit disposed in the third zone 306. The center purge distribution unit may be installed in the upper lid in a center region of the substrate supporting unit. A purge gas distribution hole for distributing the purge gas may be provided in the center purge distribution unit. Therefore, the center purge distribution unit may distribute the purge gas in a direction toward the substrate supporting unit 600. In this case, the center purge distribution unit may distribute the purge gas to the third zone 306.

The center purge distribution unit may distribute the purge gas to a portion which is a center of the process space of the chamber, and thus, a gas in the first region 10 and a gas in the second region 20 may be separated from each other at a center of the chamber.

Figure 5:
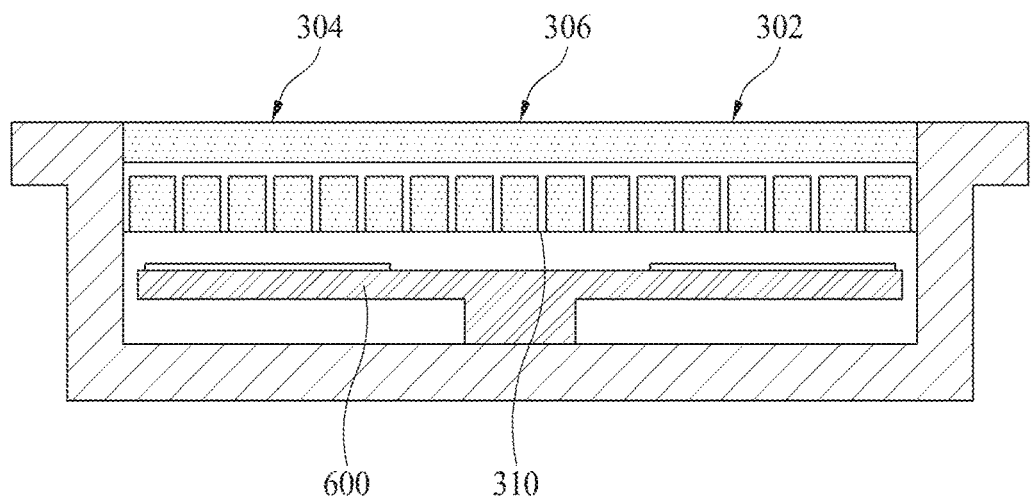
FIG. 5 is another schematic side cross-sectional view taken along line A'-A' of FIG. 2 for describing an upper lid of a chamber in an apparatus for processing a substrate according to an embodiment of the present disclosure.
Figure 6:
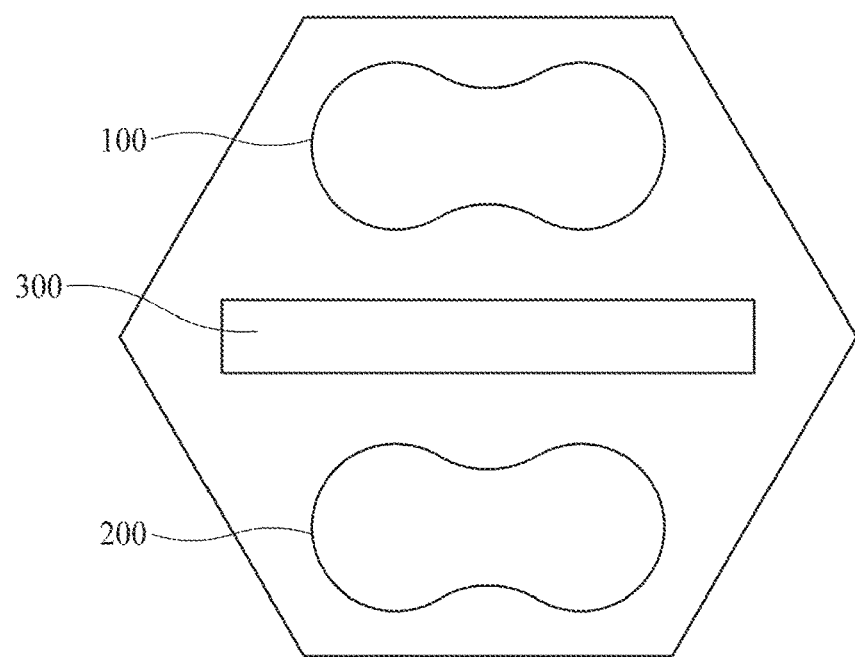
FIG. 6 is a schematic bottom view of an upper lid of a chamber in an apparatus for processing a substrate according to an embodiment of the present disclosure.

FIG. 5 is a side view taken along line A'-A' of FIG. 2 corresponding to a portion where the window 304a and the first plasma distribution unit 302a are not provided.

Referring to FIG. 5, the first purge gas distribution unit 310 may be connected to one space. Therefore, the process space may be divided into the first region 10 and the second region 20 through one first purge gas distribution unit 310.

Moreover, since the first zone 302, the second zone 304, and the third zone 306 are divided and separated from one another, the third gas distribution unit 300 may separate the process space into the first region 10 and the second region 20.

A temperature detector 810 which measures a temperature of the substrate may be disposed in a region, other than a region to which a plasma gas is distributed, of the third region 30. The temperature detector 810 may include the substrate sensing device 800 and the window 304a.

The first plasma distribution unit 302a may be connected to the remote plasma device (not shown) so as to distribute an ionized gas or a radical.

A source gas distributed from the first gas distribution unit 100 to the first region 10 may include a titanium family element (Ti, Zr, Hf, etc.), silicon (Si), or aluminum (Al). For example, a source gas SG including titanium (Ti) may be a titanium tetrachloride ($TiCl_4$) gas or the like. Also, the source gas SG containing silicon (Si) may be a silane ($SiH_4$) gas, a disilane ($Si_2H_6$) gas, a trisilane ($Si_3H_8$) gas, a tetraethylorthosilicate (TEOS) gas, a dichlorosilane (DCS) gas, a hexachlorosilane (HCD) gas, a tri-dimethylaminosilane (TriDMAS) gas, a trisilylamine (TSA) gas, or the like.

A reactant gas supplied from the second gas distribution unit 200 to the second region 20 may include a hydrogen ($H_2$) gas, a nitrogen ($N_2$) gas, an oxygen ($O_2$) gas, a nitrous oxide ($N_2O$) gas, an ammonia ($NH_3$) gas, a vapor ($H_2O$) gas, or an ozone ($O_3$) gas. In this case, the reactant gas may be mixed with a purge gas including a nitrogen ($N_2$) gas, an argon (Ar) gas, a xenon (Ze) gas, or a helium (He) gas.

Moreover, a gas for generating plasma may include a hydrogen ($H_2$) gas, a nitrogen ($N_2$) gas, a mixed gas of a hydrogen ($H_2$) gas and a nitrogen ($N_2$) gas, an oxygen ($O_2$) gas, a nitrous oxide ($N_2O$) gas, an argon (Ar) gas, a helium (He) gas, or an ammonia ($NH_3$) gas.

A purge gas which is distributed by the third gas distribution unit 300 and is supplied to the third region 30 may include a nitrogen ($N_2$) gas, an argon (Ar) gas, a xenon (Ze) gas, or a helium (He) gas. The gases may be inert gases.

Referring to FIGS. 6 to 9, in the substrate processing apparatus according to the present disclosure, the third gas distribution unit 300 may include the first purge gas distribution unit 310, a second purge gas distribution unit 320, and a center purge distribution unit 330.

The first purge gas distribution unit 310 may distribute a purge gas to the first zone 302 of the third region 30. The first plasma distribution unit 302a may be installed in the first purge gas distribution unit 310. The first plasma distribution unit 302a may distribute a plasma gas to the first zone 302. Therefore, as a source gas is adsorbed onto the substrate in the first region 10 and then the substrate supporting unit 600 rotates, the substrate may pass through the first zone 302 and may move from the first region 10 to the second region 20, and in this process, the first plasma distribution unit 302a may perform first plasma treatment on the substrate passing through the first zone 302. That is, the first plasma distribution unit 302a may perform pre-treatment by using plasma. Accordingly, the first plasma distribution unit 302a may remove internal impurities of the source gas adsorbed onto the substrate, thereby contributing to enhance the quality of a thin film deposited on the substrate.

The first plasma distribution unit 302a may be disposed in the first purge gas distribution unit 310. Therefore, when the substrate is moving from the first region 10 to the second region 20, the purge gas, the plasma gas, and the purge gas may be distributed to the substrate passing through the first zone 302. In this case, the distribution of the purge gas may be performed by the first purge gas distribution unit 310, and the distribution of the plasma gas may be performed by the first plasma distribution unit 302a. The first plasma distribution unit 302a may be implemented as the showerhead type or the electrode structure type.

The second purge gas distribution unit 320 may distribute a purge gas to the second zone 304 of the third region 30. The second plasma distribution unit 304b may be installed in the second purge gas distribution unit 320. The second plasma distribution unit 304b may distribute a plasma gas to the second zone 304. Therefore, as a thin film is deposited through an ALD process on the basis of a reaction between the source gas adsorbed onto the substrate and a reactant gas in the second region 20 and then the substrate supporting unit 600 rotates, the substrate may pass through the second zone 304 and may move from the second region 20 to the first region 10, and in this process, the second plasma distribution unit 304b may perform second plasma treatment on the substrate passing through the second zone 304. That is, the second plasma distribution unit 304b may perform pre-treatment by using plasma. Accordingly, the second plasma distribution unit 304b may remove internal impurities of the thin film deposited on the substrate, thereby densifying the thin film deposited on the substrate. Accordingly, the second plasma distribution unit 304b may more enhance the quality of the thin film deposited on the substrate.

The second plasma distribution unit 304b may be disposed in the second purge gas distribution unit 320. Therefore, when the substrate is moving from the second region 20 to the first region 10, the purge gas, the plasma gas, and the purge gas may be distributed to the substrate passing through the second zone 304. In this case, the distribution of the purge gas may be performed by the second purge gas distribution unit 320, and the distribution of the plasma gas may be performed by the second plasma distribution unit 304b. The second plasma distribution unit 304b may be implemented as the showerhead type or the electrode structure type.

The center purge distribution unit 330 may distribute a purge gas to the third zone 306 of the third region 30. Therefore, the center purge distribution unit 330 may prevent the source gas distributed to the first region 10 from being mixed with the reactant gas distributed to the second region 20 in the third zone 306. Also, the first purge gas distribution unit 310 may prevent the source gas distributed to the first region 10 from being mixed with the reactant gas distributed to the second region 20 in the first zone 302. The second purge gas distribution unit 320 may prevent the source gas distributed to the first region 10 from being mixed with the reactant gas distributed to the second region 20 in the second zone 304.

Here, the substrate processing apparatus according to the present disclosure may perform a processing process on the substrate while again moving the substrate to the first region 10 via the first region 10, the first zone 302, the second region 20, and the second zone 304 on the basis of a rotation of the substrate supporting unit 600. In this case, the substrate supporting unit 600 may be rotated by a rotation unit (not shown). A process of rotating, by the rotation unit, the substrate supporting unit 600 will be described below.

First, when the substrate is located in the first region 10, the rotation unit may stop the substrate supporting unit 600. Therefore, in a state where the substrate stops, an adsorption process of adsorbing a source gas onto the substrate may be performed in the first region 10. In this case, the first gas distribution unit 100 may distribute the source gas to the first region 10.

Subsequently, when the adsorption process ends, the rotation unit may rotate the substrate supporting unit 600 so that the substrate moves from the first region 10 to the second region 20 via the first zone 302. In this case, when the substrate is passing through the first zone 302, the rotation unit may continuously rotate the substrate supporting unit 600 without stopping the substrate supporting unit 600. When the substrate is passing through the first zone 302, the first plasma treatment may be performed on the substrate by using a plasma gas distributed by the first plasma distribution unit 302a.

Subsequently, when the substrate is located in the second region 20, the rotation unit may stop the substrate supporting unit 600. Therefore, in a state where the substrate stops, a process of depositing a thin film on the basis of a reaction between the source gas adsorbed onto the substrate and a reactant gas distributed by the second gas distribution unit 200 may be performed in the second region 20. The second gas distribution unit 200 may activate the reactant gas by using plasma and may distribute an activated reactant gas to the second region 20. In this case, the substrate processing apparatus according to the present disclosure may be implemented to be suitable for a low temperature process. For example, the substrate processing apparatus according to the present disclosure may be implemented to be suitable for a semiconductor low temperature nitride process. In this case, when the substrate is passing through the first zone 302, the first plasma distribution unit 302a may not distribute the plasma gas. The second gas distribution unit 200 may distribute the reactant gas to the second region 20 in a state which does not activate the reactant gas. In this case, the substrate processing apparatus according to the present disclosure may be implemented to be suitable for a semiconductor high temperature nitride process. In this case, when the substrate is passing through the first zone 302, the first plasma distribution unit 302a may distribute the plasma gas.

Subsequently, when the deposition process ends, the rotation unit may rotate the substrate supporting unit 600 so that the substrate moves from the second region 20 to the first region 10 via the second zone 304. In this case, when the substrate is passing through the second zone 304, the rotation unit may continuously rotate the substrate supporting unit 600 without stopping the substrate supporting unit 600. When the substrate is passing through the second zone 304, second plasma treatment may be performed on the substrate by using a plasma gas distributed by the second plasma distribution unit 304b. In a case where the substrate processing apparatus according to the present disclosure is implemented to be suitable for a low temperature process, when the substrate is passing through the second zone 304, the second plasma distribution unit 304b may not distribute the plasma gas.

As described above, when the substrate is located in the first region 10 and the substrate is located in the second region 20, the rotation unit may stop the substrate supporting unit 600. In this case, when the substrate is passing through the first zone 302 and the substrate is passing through the second zone 304, the rotation unit may continuously rotate the substrate supporting unit 600 without stopping the substrate supporting unit 600. Also, only when the substrate is located in the first region 10, the rotation unit may stop the substrate supporting unit 600, and when the substrate is passing through the first zone 302, the second region 20, and the second zone 304, the rotation unit may continuously rotate the substrate supporting unit 600 without stopping the substrate supporting unit 600.

The third gas distribution unit 300 may be implemented to distribute a plasma gas to the first zone 302 of the third region 30 to perform purging on the first zone 302. That is, the plasma gas distributed to the first zone 302 may function as a purge gas. The substrate supporting unit 600 may rotate so that the substrate passes through the first zone 302 and moves from the first region 10 to the second region 20. Therefore, the plasma gas distributed to the first zone 302 may perform purging on the first zone 302, and moreover, may perform pre-treatment on the substrate passing through the first zone 302. In this case, only the first plasma distribution unit 302a may be disposed in the first zone 302 without the first purge gas distribution unit 310.

The third gas distribution unit 300 may be implemented to distribute a plasma gas to the second zone 304 of the third region 30 to perform purging on the second zone 304. That is, the plasma gas distributed to the second zone 304 may function as a purge gas. The substrate supporting unit 600 may rotate so that the substrate passes through the second zone 304 and moves from the second region 20 to the first region 10. Therefore, the plasma gas distributed to the second zone 304 may perform purging on the second zone 304, and moreover, may perform post-treatment on the substrate passing through the second zone 304. In this case, only the second plasma distribution unit 304b may be disposed in the second zone 304 without the second purge gas distribution unit 320.

Figures 7, 8:
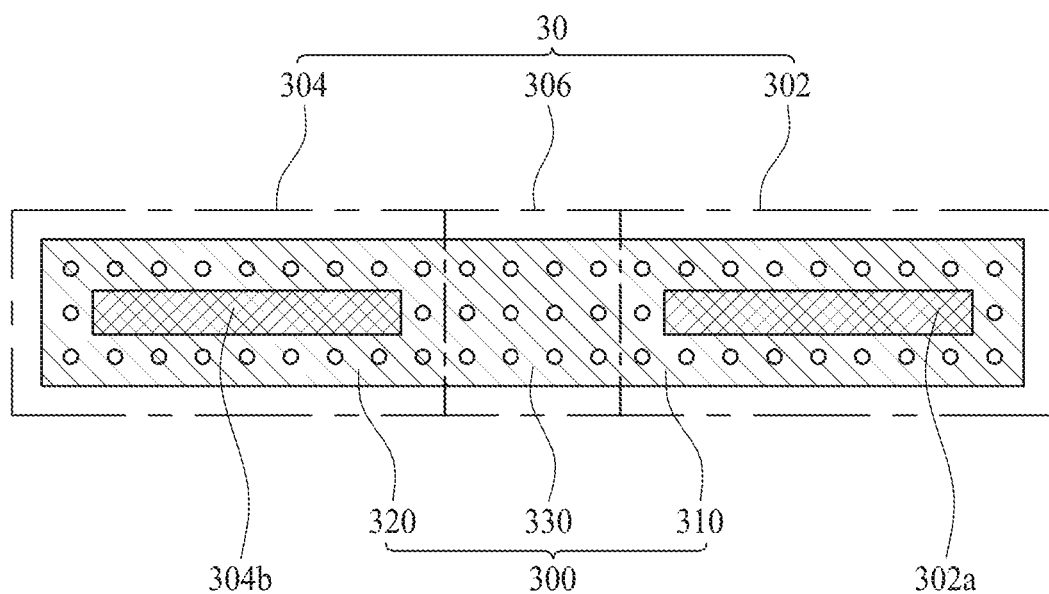
FIG. 7 is a schematic plane cross-sectional view of a third gas distribution unit in an apparatus for processing a substrate according to an embodiment of the present disclosure.
FIG. 8 is a table showing arrangement of embodiments based on a region to which a plasma gas is distributed.

Referring to FIGS. 6 to 16, the substrate processing apparatus according to the present disclosure may include various embodiments on the basis of a region to which a plasma gas is distributed. In FIG. 8, in each embodiment, a region to which the plasma gas is distributed is shown as O, and a region to which the plasma gas is not distributed is shown as X. In FIGS. 9 to 16, a portion on which a processing process is performed by using plasma is hatched. As illustrated in FIGS. 9 to 16, in a state where a first substrate S1 and a second substrate S2 are disposed at positions symmetrical with respect to a rotational axis of the substrate supporting unit 600, the substrate processing apparatus according to the present disclosure may perform a processing process on the first substrate S1 and the second substrate S2 while changing positions of the first substrate S1 and the second substrate S2 on the basis of a rotation of the substrate supporting unit 600. For example, when the first substrate S1 is located in the first region 10, the second substrate S2 may be located in the second region 20. When the second substrate S2 is located in the first region 10, the first substrate S1 may be located in the second region 20. When the first substrate S1 is located in the first zone 302, the second substrate S2 may be located in the second zone 304. When the second substrate S2 is located in the first zone 302, the first substrate S1 may be located in the second zone 304. In this case, it may be implemented that, when a processing process is performed in the first region 10 and the second region 20, a plurality of first substrates S1 and a plurality of second substrates S2 are located in each of the first region 10 and the second region 20. For example, it may be implemented that two first substrates S1 and two second substrates S2 are located in each of the first region 10 and the second region 20.

Embodiments of the substrate processing apparatus according to the present disclosure will be described below in detail with reference to the accompanying drawings.

First Embodiment

Figure 9:
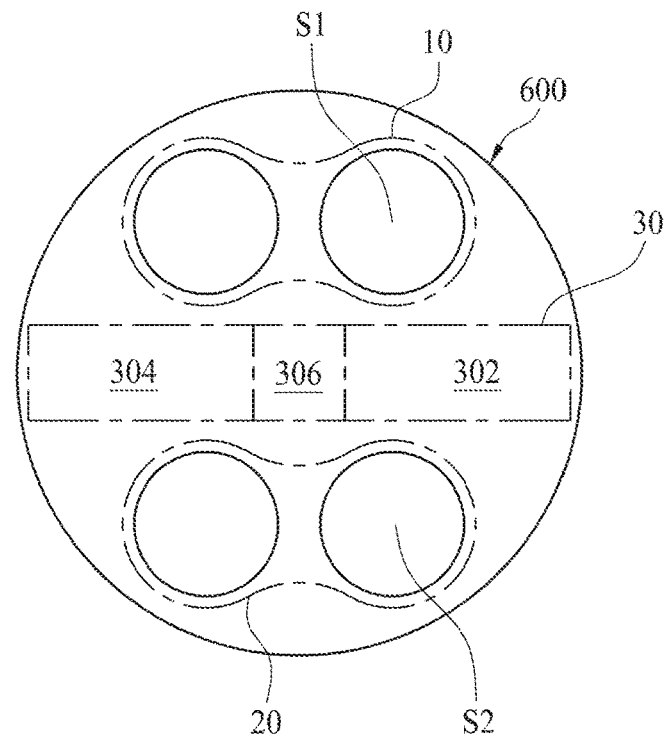
FIGS. 9 to 14B are schematic plan views of a substrate supporting unit in an apparatus for processing a substrate according to an embodiment of the present disclosure.

As illustrated in FIGS. 8 and 9, in the first embodiment, a processing process may be performed on a substrate without using plasma in all of the first region 10, the first zone 302, the second region 20, and the second zone 304. In the first embodiment, it is possible to implement a high temperature process by performing a thermal process in the second region 20. In this case, the thermal process and distribution of a reactant gas may be alternately performed in the second region 20. Therefore, in the first embodiment, step coverage of a high dielectric material or the like may be improved. Also, the first embodiment may be implemented to alternately perform the thermal process and an ALD process, and thus, a thickness of a thin film may more increase than a case where a thin film is deposited through only the ALD process.

Second Embodiment

Figure 10:
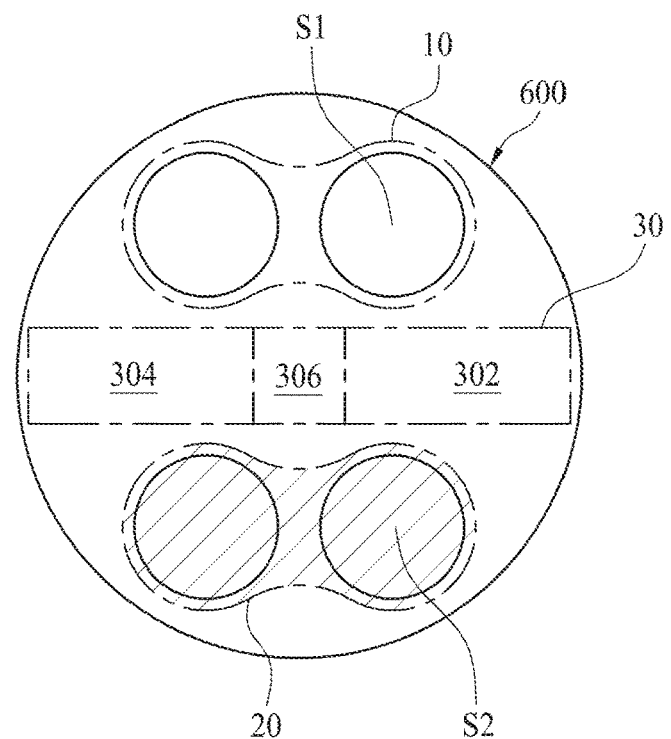

As illustrated in FIGS. 8 and 10, in the second embodiment, a processing process may be performed on a substrate by using plasma in only the second region 20 without using plasma in the first region 10, the first zone 302, and the second zone 304. In this case, a processing process using an activated reactant gas may be performed on the substrate in the second region 20. The second embodiment may be implemented to be suitable for a low temperature process. For example, the second embodiment may be implemented to be suitable for a semiconductor low temperature nitride process.

Third Embodiment

As illustrated in FIGS. 8, 9, 11A, and 11B, in the third embodiment, a processing process may be performed on a substrate by using plasma in only the first zone 302 without using plasma in the first region 10, the second region 20, and the second zone 304. An operation of the third embodiment will be described below with respect to a first substrate S1.

First, as illustrated in FIG. 9, in a state where the first substrate S1 is located in the first region 10, an adsorption process using a source gas may be performed on the first substrate S1 in the first region 10. While the adsorption process is being performed, the substrate supporting unit 600 may maintain a stop state. Also, while the adsorption process is being performed, plasma may not be generated in the first zone 302.

Figure 11A:
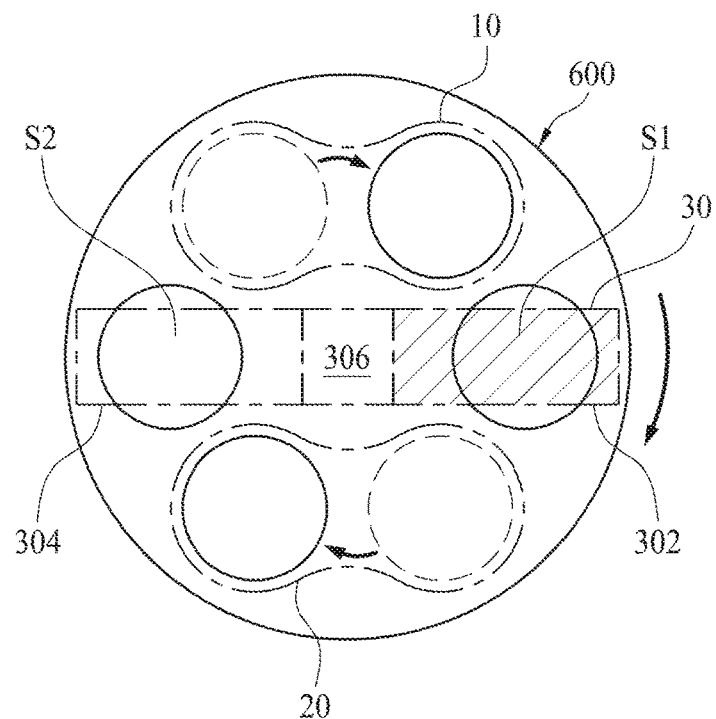

Subsequently, when the adsorption process ends, as the substrate supporting unit 600 rotates, the first substrate S1 may pass through the first zone 302 and may move from the first region 10 to the second region 20. In this case, as illustrated in FIG. 11A, when the first substrate S1 is passing through the first zone 302, the first plasma treatment using plasma may be performed on the first substrate S1 in the first zone 302. That is, pre-treatment may be performed by using plasma in the first zone 302. Accordingly, in the third embodiment, internal impurities of a source gas adsorbed onto a substrate may be removed by using plasma in the first zone 302, thereby enhancing the quality of a thin film deposited on the substrate. After the first substrate S1 passes through the first zone 302, plasma may not be generated in the first zone 302.

Figure 11B:
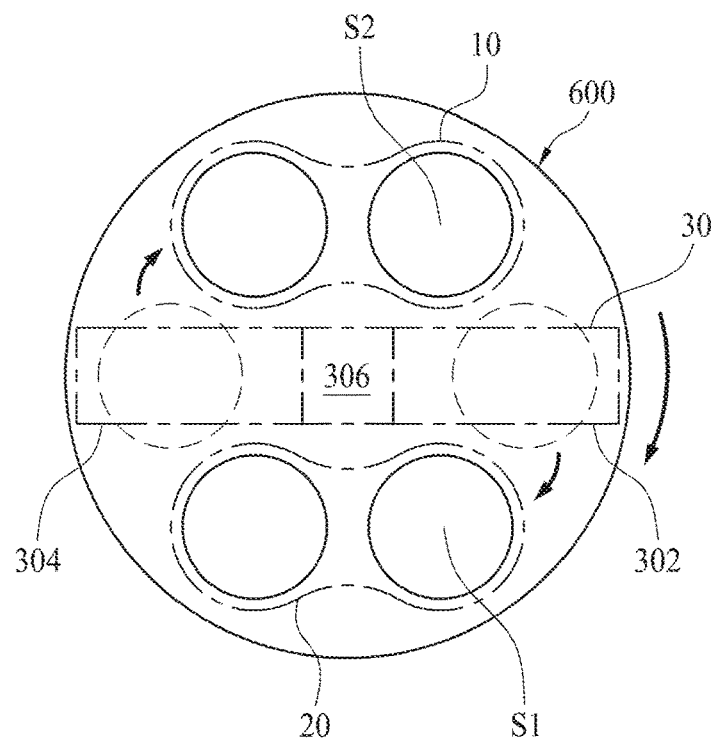

Subsequently, as illustrated in FIG. 11B, when the first substrate S1 is located in the second region 20, a deposition process using a reactant gas may be performed on the first substrate S1 in the second region 20. While the deposition process is being performed, the substrate supporting unit 600 may maintain a stop state. Also, while the deposition process is being performed, plasma may not be generated in the first zone 302.

Subsequently, when the deposition process ends, as the substrate supporting unit 600 rotates, the first substrate S1 may pass through the second zone 304 and may move from the second region 20 to the first region 10. When the first substrate S1 is passing through the second zone 304, plasma may be generated in the first zone 302. Also, after the first substrate S1 passes through the second zone 304, plasma may not be generated in the first zone 302. As described above, the third embodiment may be implemented so that plasma is generated in the first zone 302 only when the substrate supporting unit 600 is rotating, and plasma is not generated in the first zone 302 when the substrate supporting unit 600 stops. The third embodiment may be implemented so that a purge gas is continuously distributed to the third region 30 when the substrate supporting unit 600 is rotating and when the substrate supporting unit 600 stops.

Fourth Embodiment

Figure 12:
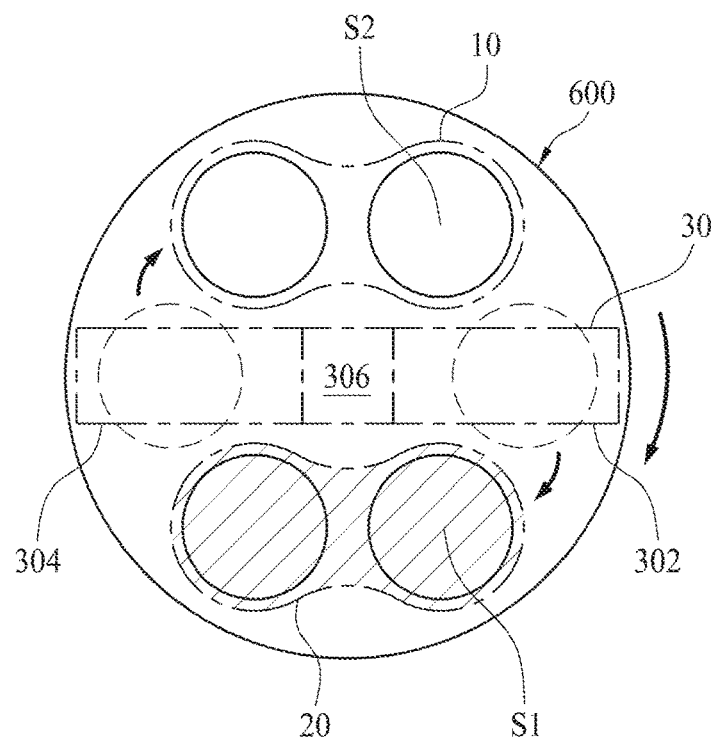

As illustrated in FIGS. 9, 11A, and 12, in the fourth embodiment, a processing process may be performed on a substrate by using plasma in each of the first zone 302 and the second region 20 without using plasma in the first region 10 and the second zone 304. An operation of the fourth embodiment will be described below with respect to a first substrate S1.

First, as illustrated in FIG. 9, in a state where the first substrate S1 is located in the first region 10, an adsorption process using a source gas may be performed on the first substrate S1 in the first region 10. While the adsorption process is being performed, the substrate supporting unit 600 may maintain a stop state. Also, while the adsorption process is being performed, plasma may not be generated in the first zone 302.

Subsequently, when the adsorption process ends, as the substrate supporting unit 600 rotates, the first substrate S1 may pass through the first zone 302 and may move from the first region 10 to the second region 20. In this case, as illustrated in FIG. 11A, when the first substrate S1 is passing through the first zone 302, the first plasma treatment using plasma may be performed on the first substrate S1 in the first zone 302. That is, pre-treatment may be performed by using plasma in the first zone 302. Accordingly, in the fourth embodiment, internal impurities of a source gas adsorbed onto a substrate may be removed by using plasma in the first zone 302, thereby enhancing the quality of a thin film deposited on the substrate. While plasma is being generated in the first zone 302, plasma may not be generated in the second region 20. Also, after the first substrate S1 passes through the first zone 302, plasma may not be generated in the first zone 302.

Subsequently, as illustrated in FIG. 12, when the first substrate S1 is located in the second region 20, a deposition process using an activated reactant gas may be performed on the first substrate S1 in the second region 20. While the adsorption process is being performed, the substrate supporting unit 600 may maintain a stop state. As described above, the fourth embodiment may be implemented so that a substrate, which a source gas is adsorbed onto and pre-treatment is performed on in the first region 10 and the first zone 302, is exposed to plasma in the second region 20 again, thereby decreasing a deposition thickness of an upper surface to enhance a gap-fill effect. Also, while the deposition process is being performed, plasma may not be generated in the first zone 302.

Subsequently, when the deposition process ends, as the substrate supporting unit 600 rotates, the first substrate S1 may pass through the second zone 304 and may move from the second region 20 to the first region 10. In this case, when the first substrate S1 is passing through the second zone 304, plasma may be generated in the first zone 302. Also, when the first substrate S1 is passing through the second zone 304, plasma may not be generated in the second region 20. As described above, the fourth embodiment may be implemented so that plasma is generated in the first zone 302 only when the substrate supporting unit 600 is rotating, and plasma is not generated in the first zone 302 when the substrate supporting unit 600 stops. Also, the fourth embodiment may be implemented so that plasma is generated in the second region 20 only when the substrate supporting unit 600 stops, and plasma is not generated in the second region 20 when the substrate supporting unit 600 is rotating. The fourth embodiment may be implemented so that a purge gas is continuously distributed to the third region 30 when the substrate supporting unit 600 is rotating and when the substrate supporting unit 600 stops.

Fifth Embodiment

As illustrated in FIGS. 12 and 13A to 13C, in the fifth embodiment, a processing process may be performed on a substrate by using plasma in each of the first zone 302, the second region 20, and the second zone 304 without using plasma in only the first region 10. An operation of the fifth embodiment will be described below with respect to a first substrate S1.

Figure 13A:
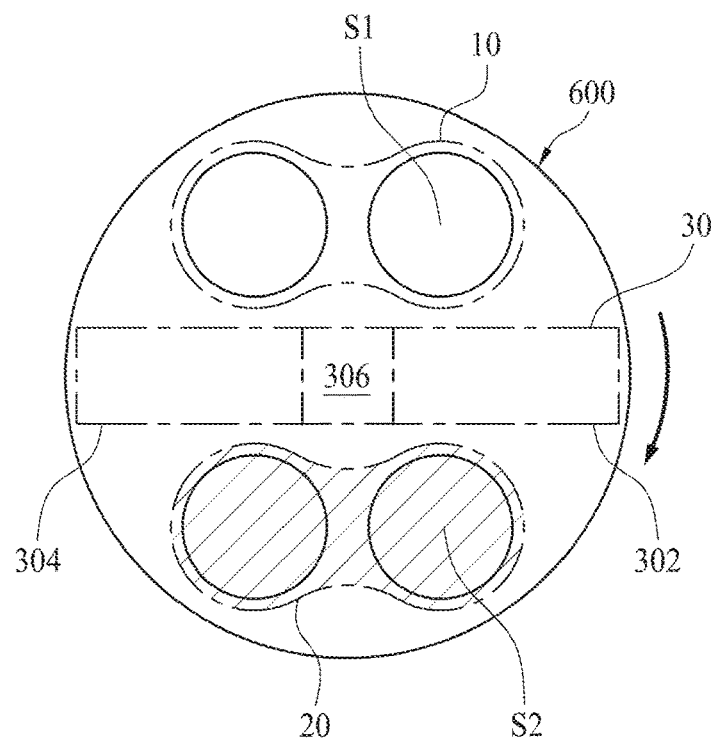

First, as illustrated in FIG. 13A, in a state where the first substrate S1 is located in the first region 10, an adsorption process using a source gas may be performed on the first substrate S1 in the first region 10. While the adsorption process is being performed, the substrate supporting unit 600 may maintain a stop state. While the adsorption process is being performed, plasma may be generated in the second region 20. Also, while the adsorption process is being performed, plasma may not be generated in the second zone 304.

Figure 13B:
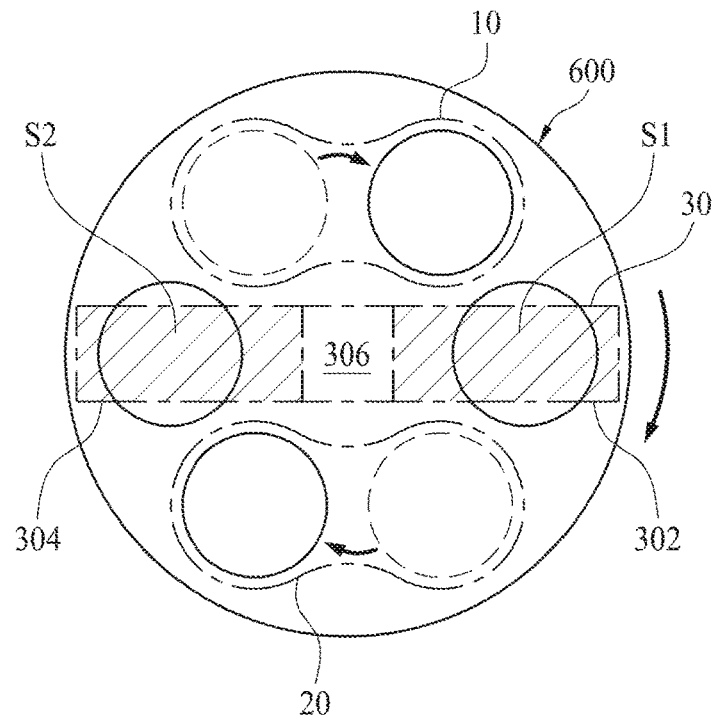

Subsequently, when the adsorption process ends, as the substrate supporting unit 600 rotates, the first substrate S1 may pass through the first zone 302 and may move from the first region 10 to the second region 20. In this case, as illustrated in FIG. 13B, when the first substrate S1 is passing through the first zone 302, the first plasma treatment using plasma may be performed on the first substrate S1 in the first zone 302. That is, pre-treatment may be performed by using plasma in the first zone 302. Accordingly, in the fifth embodiment, internal impurities of a source gas adsorbed onto a substrate may be removed by using plasma in the first zone 302, thereby enhancing the quality of a thin film deposited on the substrate. While plasma is being generated in the first zone 302, plasma may not be generated in the second region 20. Also, after the first substrate S1 passes through the first zone 302, plasma may not be generated in the first zone 302. The fifth embodiment may be implemented so that plasma is generated in the second zone 304 while the substrate supporting unit 600 is rotating in order for the first substrate S1 to pass through the first zone 302. After the first substrate S1 passes through the first zone 302, plasma may not be generated in the second zone 304.

Subsequently, as illustrated in FIG. 12, when the first substrate S1 is located in the second region 20, a deposition process using an activated reactant gas may be performed on the first substrate S1 in the second region 20. While the adsorption process is being performed, the substrate supporting unit 600 may maintain a stop state. As described above, the fifth embodiment may be implemented so that a substrate, which a source gas is adsorbed onto and pre-treatment is performed on in the first region 10 and the first zone 302, is exposed to plasma in the second region 20 again, thereby decreasing a deposition thickness of an upper surface to enhance a gap-fill effect. Also, while the deposition process is being performed, plasma may not be generated in the first zone 302 and the second zone 304.

Figure 13C:
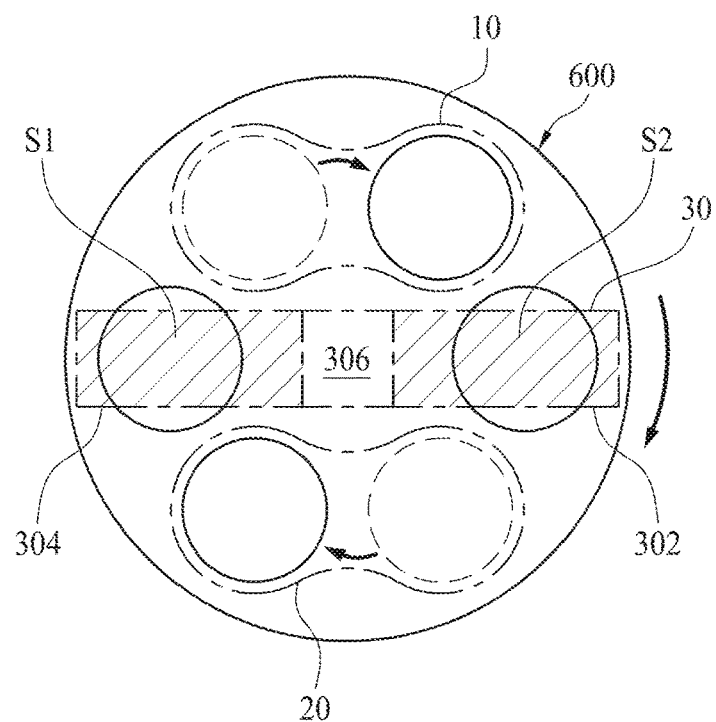

Subsequently, when the deposition process ends, as the substrate supporting unit 600 rotates, the first substrate S1 may pass through the second zone 304 and may move from the second region 20 to the first region 10. In this case, as illustrated in FIG. 13C, when the first substrate S1 is passing through the second zone 304, the second plasma treatment using plasma may be performed on the first substrate S1 in the second zone 304. That is, post-treatment may be performed by using plasma in the second zone 304. Therefore, in the fifth embodiment, densification of a thin film deposited on the substrate may increase by removing internal impurities of the thin film deposited on the substrate in second zone 304, thereby more enhancing the quality of the thin film deposited on the substrate. As described above, the fifth embodiment may be implemented so that generating of a deposition film is reduced by cutting a ligand of a source gas on the substrate with the source gas adsorbed thereonto through the pre-treatment and a thin film deposited through an ALD process is more densified through the post-treatment.

While plasma is being generated in the second zone 304, plasma may not be generated in the second region 20. Also, as the first substrate S1 passes through the second zone 304, plasma may not be generated in the second zone 304. Also, the fifth embodiment may be implemented so that plasma is generated in the first zone 302 while the substrate supporting unit 600 is rotating in order for the first substrate S1 to pass through the second zone 304. After the first substrate S1 passes through the second zone 304, plasma may not be generated in the first zone 302. As described above, the fifth embodiment may be implemented so that plasma is generated in the first zone 302 and the second zone 304 only when the substrate supporting unit 600 is rotating, and plasma is not generated in the first zone 302 and the second zone 304 when the substrate supporting unit 600 stops. Also, the fifth embodiment may be implemented so that plasma is generated in the second region 20 only when the substrate supporting unit 600 stops, and plasma is not generated in the second region 20 when the substrate supporting unit 600 is rotating. The fifth embodiment may be implemented so that a purge gas is continuously distributed to the third region 30 when the substrate supporting unit 600 is rotating and when the substrate supporting unit 600 stops.

Sixth Embodiment

As illustrated in FIGS. 12, 13A, 14A, and 14B, in the sixth embodiment, a processing process may be performed on a substrate by using plasma in each of the second region 20 and the second zone 304 without using plasma in the first region 10 and the first zone 302. An operation of the sixth embodiment will be described below with respect to a first substrate S1.

First, as illustrated in FIG. 13A, in a state where the first substrate S1 is located in the first region 10, an adsorption process using a source gas may be performed on the first substrate S1 in the first region 10. While the adsorption process is being performed, the substrate supporting unit 600 may maintain a stop state. While the adsorption process is being performed, plasma may be generated in the second region 20. Also, while the adsorption process is being performed, plasma may not be generated in the second zone 304.

Figure 14A:
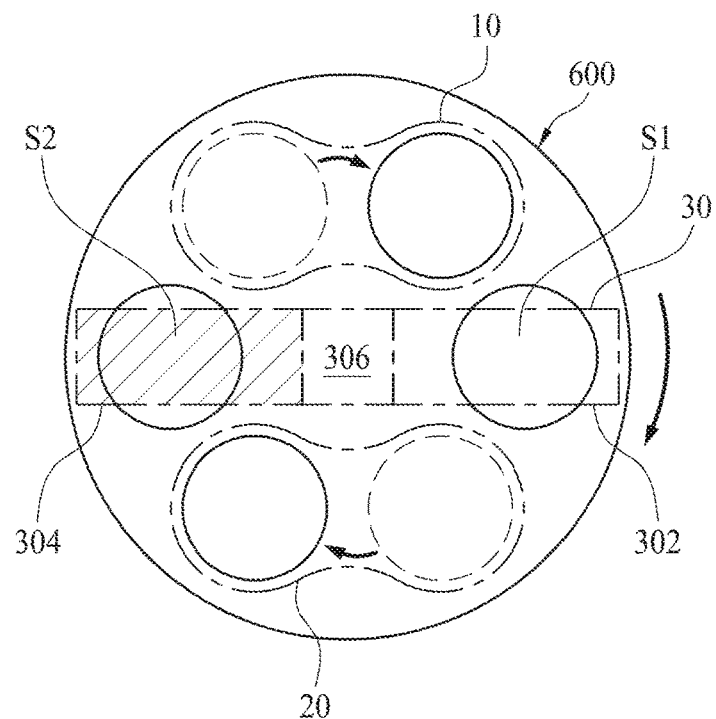

Subsequently, when the adsorption process ends, as the substrate supporting unit 600 rotates, the first substrate S1 may pass through the first zone 302 and may move from the first region 10 to the second region 20. In this case, as illustrated in FIG. 14A, when the first substrate S1 is passing through the first zone 302, plasma may not be generated in the first zone 302. The sixth embodiment may be implemented so that plasma is generated in the second zone 304 and is not generated in the second region 20 while the substrate supporting unit 600 is rotating in order for the first substrate S1 to pass through the first zone 302. After the first substrate S1 passes through the first zone 302, plasma may not be generated in the second zone 304.

Subsequently, as illustrated in FIG. 12, when the first substrate S1 is located in the second region 20, a deposition process using an activated reactant gas may be performed on the first substrate S1 in the second region 20. While the deposition process is being performed, the substrate supporting unit 600 may maintain a stop state. Also, while the deposition process is being performed, plasma may not be generated in the second zone 304.

Figure 14B:
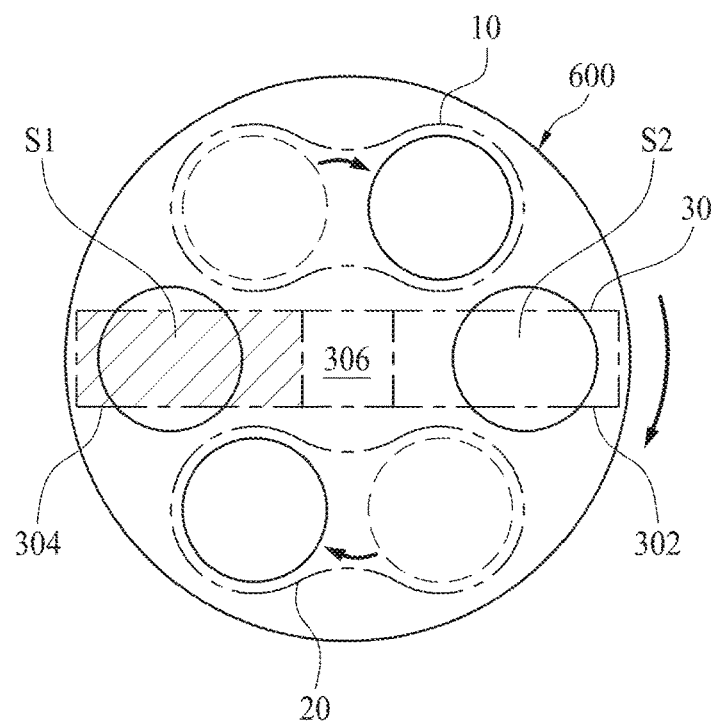
Figure 15:
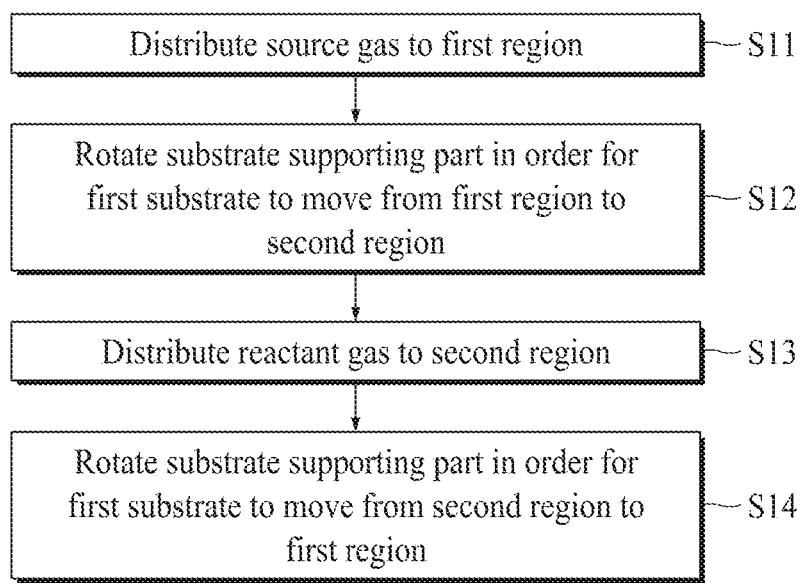
FIG. 15 is a schematic flowchart of a method of processing a substrate according to the present disclosure.

Subsequently, when the deposition process ends, as the substrate supporting unit 600 rotates, the first substrate S1 may pass through the second zone 304 and may move from the second region 20 to the first region 10. In this case, as illustrated in FIG. 14B, when the first substrate S1 is passing through the second zone 304, the second plasma treatment using plasma may be performed on the first substrate S1 in the second zone 304. That is, post-treatment may be performed by using plasma in the second zone 304. Therefore, in the sixth embodiment, densification of a thin film deposited on the substrate may increase by removing internal impurities of the thin film deposited on the substrate in second zone 304, thereby more enhancing the quality of the thin film deposited on the substrate. Also, the sixth embodiment may be implemented so that the thin film is deposited on the substrate by using a reactant gas activated by plasma in the second region 20, and then, post-treatment using plasma is performed while rotating the substrate on the basis of a rotation of the substrate supporting unit 600. Accordingly, in the sixth embodiment, a process time may be shortened, thereby more enhancing the quality of the thin film.

While plasma is being generated in the second zone 304, plasma may not be generated in the second region 20. Also, after the first substrate S1 passes through the second zone 304, plasma may not be generated in the second zone 304. As described above, the sixth embodiment may be implemented so that plasma is generated in the second zone 304 only when the substrate supporting unit 600 is rotating, and plasma is not generated in the second zone 304 when the substrate supporting unit 600 stops. Also, the sixth embodiment may be implemented so that plasma is generated in the second region 20 only when the substrate supporting unit 600 stops, and plasma is not generated in the second region 20 when the substrate supporting unit 600 is rotating. The sixth embodiment may be implemented so that a purge gas is continuously distributed to the third region 30 when the substrate supporting unit 600 is rotating and when the substrate supporting unit 600 stops.

Seventh Embodiment

As illustrated in FIGS. 8, 9, 11B, 14A, and 14B, in the seventh embodiment, a processing process may be performed on a substrate by using plasma in only the second zone 304 without using plasma in the first region 10, the first zone 302, and the second region 20. An operation of the seventh embodiment will be described below with respect to a first substrate S1.

First, as illustrated in FIG. 9, in a state where the first substrate S1 is located in the first region 10, an adsorption process using a source gas may be performed on the first substrate S1 in the first region 10. While the adsorption process is being performed, the substrate supporting unit 600 may maintain a stop state. Also, while the adsorption process is being performed, plasma may not be generated in the second zone 304.

Subsequently, when the adsorption process ends, as the substrate supporting unit 600 rotates, the first substrate S1 may pass through the first zone 302 and may move from the first region 10 to the second region 20. In this case, as illustrated in FIG. 14A, when the first substrate S1 is passing through the first zone 302, plasma is not generated in the first zone 302. The seventh embodiment may be implemented so that plasma is not generated in the second zone 304 while the substrate supporting unit 600 is rotating in order for the first substrate S1 to pass through the first zone 302. After the first substrate S1 passes through the first zone 302, plasma may not be generated in the second zone 304.

Subsequently, as illustrated in FIG. 11B, when the first substrate S1 is located in the second region 20, a deposition process using a reactant gas may be performed on the first substrate S1 in the second region 20. While the deposition process is being performed, the substrate supporting unit 600 may maintain a stop state. Also, while the deposition process is being performed, plasma may not be generated in the second zone 304.

Subsequently, when the deposition process ends, as the substrate supporting unit 600 rotates, the first substrate S1 may pass through the second zone 304 and may move from the second region 20 to the first region 10. In this case, as illustrated in FIG. 14B, when the first substrate S1 is passing through the second zone 304, the second plasma treatment using plasma may be performed on the first substrate S1 in the second zone 304. That is, post-treatment may be performed by using plasma in the second zone 304. Therefore, in the seventh embodiment, densification of a thin film deposited on the substrate may increase by removing internal impurities of the thin film deposited on the substrate in second zone 304, thereby more enhancing the quality of the thin film deposited on the substrate. After the first substrate S1 passes through the second zone 304, plasma may not be generated in the second zone 304. As described above, the seventh embodiment may be implemented so that plasma is generated in the second zone 304 only when the substrate supporting unit 600 is rotating, and plasma is not generated in the second zone 304 when the substrate supporting unit 600 stops. The seventh embodiment may be implemented so that a purge gas is continuously distributed to the third region 30 when the substrate supporting unit 600 is rotating and when the substrate supporting unit 600 stops.

Eighth Embodiment

As illustrated in FIGS. 8, 9, 11B, 13B, and 13C, in the eighth embodiment, a processing process may be performed on a substrate by using plasma in each of the first zone 302 and the second zone 304 without using plasma in the first region 10 and the second region 20. An operation of the eighth embodiment will be described below with respect to a first substrate S1.

First, as illustrated in FIG. 9, in a state where the first substrate S1 is located in the first region 10, an adsorption process using a source gas may be performed on the first substrate S1 in the first region 10. While the adsorption process is being performed, the substrate supporting unit 600 may maintain a stop state. Also, while the adsorption process is being performed, plasma may not be generated in the first zone 302 and the second zone 304.

Subsequently, when the adsorption process ends, as the substrate supporting unit 600 rotates, the first substrate S1 may pass through the first zone 302 and may move from the first region 10 to the second region 20. In this case, as illustrated in FIG. 13B, when the first substrate S1 is passing through the first zone 302, the first plasma treatment using plasma may be performed on the first substrate S1 in the first zone 302. That is, pre-treatment may be performed by using plasma in the first zone 302. Accordingly, in the eighth embodiment, internal impurities of a source gas adsorbed onto a substrate may be removed by using plasma in the first zone 302, thereby enhancing the quality of a thin film deposited on the substrate. After the first substrate S1 passes through the first zone 302, plasma may not be generated in the first zone 302. The eighth embodiment may be implemented so that plasma is generated in the second zone 304 while the substrate supporting unit 600 is rotating in order for the first substrate S1 to pass through the first zone 302. After the first substrate S1 passes through the first zone 302, plasma may not be generated in the second zone 304.

Subsequently, as illustrated in FIG. 11B, when the first substrate S1 is located in the second region 20, a deposition process using a reactant gas may be performed on the first substrate S1 in the second region 20. While the deposition process is being performed, the substrate supporting unit 600 may maintain a stop state. Also, while the deposition process is being performed, plasma may not be generated in the first zone 302 and the second zone 304.

Subsequently, when the deposition process ends, as the substrate supporting unit 600 rotates, the first substrate S1 may pass through the second zone 304 and may move from the second region 20 to the first region 10. In this case, as illustrated in FIG. 13C, when the first substrate S1 is passing through the second zone 304, the second plasma treatment using plasma may be performed on the first substrate S1 in the second zone 304. That is, post-treatment may be performed by using plasma in the second zone 304. Therefore, in the eighth embodiment, densification of a thin film deposited on the substrate may increase by removing internal impurities of the thin film deposited on the substrate in second zone 304, thereby more enhancing the quality of the thin film deposited on the substrate. As described above, the eighth embodiment may be implemented so that generating of a deposition film is reduced by cutting a ligand of a source gas on the substrate with the source gas adsorbed thereonto through the pre-treatment and a thin film deposited through an ALD process is more densified through the post-treatment.

After the first substrate S1 passes through the second zone 304, plasma may not be generated in the second zone 304. Also, the eighth embodiment may be implemented so that plasma is generated in the first zone 302 while the substrate supporting unit 600 is rotating in order for the first substrate S1 to pass through the second zone 304. After the first substrate S1 passes through the second zone 304, plasma may not be generated in the first zone 302. As described above, the eighth embodiment may be implemented so that plasma is generated in the first zone 302 and the second zone 304 only when the substrate supporting unit 600 is rotating, and plasma is not generated in the first zone 302 and the second zone 304 when the substrate supporting unit 600 stops. Also, the eighth embodiment may be implemented so that a purge gas is continuously distributed to the third region 30 when the substrate supporting unit 600 is rotating and when the substrate supporting unit 600 stops.

As described above, embodiments of the substrate processing apparatus according to the present disclosure may be implemented so that, in a case where a processing process using plasma is performed in at least one of the first zone 302 and the second zone 304, plasma is generated in at least one of the first zone 302 and the second zone 304 only when the substrate supporting unit 600 is rotating, and moreover, plasma is not generated in all of the first zone 302 and the second zone 304 when the substrate supporting unit 600 stops. Accordingly, the substrate processing apparatus according to the present disclosure is implemented so that plasma generated in at least one of the first zone 302 and the second zone 304 is prevented from affecting an adsorption process and a deposition process, and thus, the quality of a substrate undergoing the adsorption process and the deposition process is more enhanced.

Hereinafter, an embodiment of a substrate processing method according to the present disclosure will be described in detail with reference to the accompanying drawings.

Referring to FIGS. 1 to 15, the substrate processing method according to the present disclosure may be performed by the substrate processing apparatus according to the present disclosure described above. The substrate processing method according to the present disclosure may include the following steps.

First, an adsorption process may be performed by distributing a source gas to the first region 10 in step S11. When the first substrate S1 is disposed in the first region 10, step S11 may be performed by the first gas distribution unit 100 distributing the source gas to the first region 10. Therefore, the adsorption process may be performed on the first substrate S1 disposed in the first region 10. While the adsorption process is being performed, the substrate supporting unit 600 may be maintained in a stop state.

Subsequently, when the adsorption process ends, the substrate supporting unit 600 may rotate so that the first substrate S1 is disposed in the second region 20 in step S12. Such step S12 may be performed by moving the first substrate S1 from the first region 10 to the second region 20 on the basis of a rotation of the substrate supporting unit 600. In this case, the first substrate S1 may pass through the first zone 302 of the third region 30 and may move from the first region 10 to the second region 20, in order to be disposed in the second region 20.

Subsequently, when the first substrate S1 is disposed in the second region 20, a deposition process may be performed by distributing a reactant gas to the second region 20 in step S13. Such step S13 may be performed by the second gas distribution unit 200 distributing the reactant gas to the second region 20. Therefore, the deposition process may be performed on the first substrate S1 disposed in the second region 20. While the deposition process is being performed, the substrate supporting unit 600 may be maintained in a stop state.

Subsequently, when the deposition process ends, the substrate supporting unit 600 rotates so that the first substrate S1 is disposed in the first region 10 in step S14. Such step S14 may be performed by moving the first substrate S1 from the second region 20 to the first region 10 on the basis of a rotation of the substrate supporting unit 600. In this case, the first substrate S1 may pass through the second zone 304 of the third region 30 and may move from the second region 20 to the first region 10, in order to be disposed in the first region 10.

By repeatedly performing the above-described steps, the substrate processing method according to the present disclosure may deposit a thin film on the first substrate S1 by using an ALD process. While the above-described steps are being performed, the substrate processing method according to the present disclosure may include a step of continuously distributing a purge gas to the third region 30. Also, the substrate processing method according to the present disclosure may be implemented so that, in a case where a thin film is deposited on the first substrate S1, a thin film is also deposited on the second substrate S2 disposed at a position symmetrical with respect to the rotation axis of the substrate supporting unit 600. That is, the substrate processing method according to the present disclosure may perform the above-described steps on the first substrate S1 and the second substrate S2. In this case, a plurality of first substrates S1 and a plurality of second substrates S2 are disposed in each of the first region 10 and the second region 20.

Here, in step S13 of performing the deposition process, the deposition process may be performed by distributing a reactant gas, activated by using plasma, to the second region 20. Therefore, the substrate processing method according to the present disclosure may be implemented to be suitable for a low temperature process. For example, the substrate processing method according to the present disclosure may be implemented to be suitable for a semiconductor low temperature nitride process. Plasma corresponding to the second region 20 may be generated only when the substrate supporting unit 600 stops. Plasma may not be generated in the second region 20 when the substrate supporting unit 600 is rotating.

Here, step S12 of rotating the substrate supporting unit in order for the first substrate to be disposed in the second region may be performed by generating plasma in the first zone 302 while the first substrate S1 is passing through the first zone 302 of the third region 30, in rotating the substrate supporting unit 600 in order for the first substrate S1 to pass through the first zone 302. Therefore, the substrate processing method according to the present disclosure may be implemented so that the first plasma treatment using plasma is performed on the first substrate S1 in the first zone 302. That is, pre-treatment may be performed by using plasma in the first zone 302. Accordingly, in the substrate processing method according to the present disclosure, internal impurities of a source gas adsorbed onto a substrate may be removed by using plasma in the first zone 302, thereby enhancing the quality of a thin film deposited on the substrate. Generating of plasma in the first zone 302 may be performed by the first plasma distribution unit 302a distributing a plasma gas to the first zone 302. Plasma may be generated in the first zone 302 only when the substrate supporting unit 600 is rotating. Plasma may not be generated in the first zone 302 when the substrate supporting unit 600 stops.

Here, step S14 of rotating the substrate supporting unit in order for the first substrate to be disposed in the first region may be performed by generating plasma in the second zone 304 while the first substrate S1 is passing through the second zone 304 of the third region 30, in rotating the substrate supporting unit 600 in order for the first substrate S1 to pass through the second zone 304. Therefore, the substrate processing method according to the present disclosure may be implemented so that the second plasma treatment using plasma is performed on the first substrate S1 in the second zone 304. That is, pre-treatment may be performed by using plasma in the second zone 304. Accordingly, in the substrate processing method according to the present disclosure, densification of a thin film deposited on the substrate may increase by removing internal impurities of the thin film deposited on the substrate in second zone 304, thereby more enhancing the quality of the thin film deposited on the substrate. Generating of plasma in the second zone 304 may be performed by the second plasma distribution unit 304b distributing a plasma gas to the second zone 304. Plasma may be generated in the second zone 304 only when the substrate supporting unit 600 is rotating. Plasma may not be generated in the second zone 304 when the substrate supporting unit 600 stops.

Here, step S13 of rotating the substrate supporting unit in order for the first substrate to be disposed in the second region and step S14 of rotating the substrate supporting unit in order for the first substrate to be disposed in the first region may be performed by generating plasma in the first zone 302 and the second zone 304 of the third region 30. Therefore, the substrate processing method according to the present disclosure may be implemented so that pre-treatment is performed by using plasma in the first zone 302 and post-treatment is performed by using plasma in the second zone 304. Therefore, the substrate processing method according to the present disclosure may be implemented so that generating of a deposition film is reduced by cutting a ligand of a source gas on the substrate with the source gas adsorbed thereonto through the pre-treatment and a thin film deposited through an ALD process is more densified through the post-treatment. In this case, plasma corresponding to the first zone 302 and plasma corresponding to the second zone 304 may be generated only when the substrate supporting unit 600 is rotating. Plasma is not generated in all of the first zone 302 and the second zone 304 when the substrate supporting unit 600 stops.

As described above, the substrate processing method according to the present disclosure may be implemented so that, in a case where a processing process using plasma is performed in at least one of the first zone 302 and the second zone 304, plasma is generated in at least one of the first zone 302 and the second zone 304 only when the substrate supporting unit 600 is rotating, and plasma is not generated in all of the first zone 302 and the second zone 304 when the substrate supporting unit 600 stops. Accordingly, the substrate processing method according to the present disclosure is implemented so that plasma generated in at least one of the first zone 302 and the second zone 304 is prevented from affecting an adsorption process and a deposition process, and thus, the quality of a substrate undergoing the adsorption process and the deposition process is more enhanced. Also, the substrate processing method according to the present disclosure may perform a processing process on a substrate by using steps described above in each of the first to eighth embodiments of the substrate processing apparatus according to the present disclosure.

Those skilled in the art can understand that the present disclosure can be embodied in another detailed form without changing the technical spirit or the essential features. Therefore, it should be understood that the embodiments described above are exemplary from every aspect and are not restrictive. It should be construed that the scope of the present disclosure is defined by the below-described claims instead of the detailed description, and the meanings and scope of the claims and all variations or modified forms inferred from their equivalent concepts are included in the scope of the present disclosure.

The invention claimed is:

1. An apparatus for processing a substrate, the apparatus comprising:
   a chamber;
   a substrate supporting unit rotatably installed in a process space of the chamber to support a substrate;
   a first gas distribution unit for distributing a source gas to a first region of the process space;
   a second gas distribution unit for distributing a reactant gas, reacting with the source gas, to a second region of the process space; and
   a third gas distribution unit for distributing a purge gas, dividing the first region and the second region, to a third region,
   wherein the third gas distribution unit is configured to distribute a plasma gas to a first zone and a second zone of the third region, and to distribute the purge gas to the first zone, the second zone, and a third zone of the third region, wherein the third zone is located between the first zone and the second zone.

2. The apparatus of claim 1, wherein a plasma gas is distributed to the second region through the second gas distribution unit.

3. The apparatus of claim 1, wherein
   a plasma distribution unit is disposed in the first zone of the third region, and
   the plasma distribution unit distributes the plasma gas to the first zone.

4. The apparatus of claim 3, wherein plasma is generated in the first zone only when the substrate supporting unit is rotating.

5. The apparatus of claim 1, wherein
   a plasma distribution unit is disposed in the second zone of the third region, and
   the plasma distribution unit distributes the plasma gas to the second zone.

6. The apparatus of claim 5, wherein plasma is generated in the second zone only when the substrate supporting unit is rotating.

7. The apparatus of claim 1, wherein a plasma gas is distributed through the third gas distribution unit to all of the first zone and the second zone of the third region.

8. The apparatus of claim 7, wherein plasma is generated in each of the first zone and the second zone only when the substrate supporting unit is rotating.

9. The apparatus of claim 7, wherein
   the third gas distribution unit comprises a first plasma distribution unit disposed in the first zone and a second plasma distribution unit disposed in the second zone, and
   each of the first plasma distribution unit and the second plasma distribution unit is configured with a first electrode and a second electrode having an electric potential difference therebetween to generate plasma.

10. The apparatus of claim 1, wherein a temperature detector measuring a temperature of a substrate in the third region is installed in the third gas distribution unit.

11. The apparatus of claim 1, wherein
    a first plasma distribution unit is disposed in the first zone of the third region,
    a second plasma distribution unit is disposed in the second zone of the third region, and
    the first plasma distribution unit or the second plasma distribution unit is configured with a first electrode and a second electrode having an electric potential difference therebetween to generate plasma.

12. The apparatus of claim 1, wherein
    a first plasma distribution unit is disposed in the first zone of the third region,
    a second plasma distribution unit is disposed in the second zone of the third region, and
    the first plasma distribution unit or the second plasma distribution unit distributes an ionized gas or a radical.

13. The apparatus of claim 1, wherein the third gas distribution unit comprises a center "purge distribution unit distributing the purge gas to a center region of the substrate supporting unit in the third zone.

14. The apparatus of claim 1, wherein
    the third gas distribution unit comprises a first purge gas distribution unit distributing the purge gas to the first zone of the third region and a first plasma distribution unit distributing the plasma gas to the first zone.

15. The apparatus of claim 1, wherein
    the third gas distribution unit distributes the plasma gas to the first zone of the third region to perform purging on the first zone.

16. The apparatus of claim 1, wherein
    the third gas distribution unit distributes the plasma gas to the second zone of the third region to perform purging on the second zone.

17. The apparatus of claim 1, wherein,
    the third gas distribution unit is configured to distribute the purge gas to the third region, wherein the third region is smaller than each of the first region and the second region,
    the first gas distribution unit is configured to perform a process of adsorbing the source gas onto the substrate in the first region, which is lager that the third region,
    the second gas distribution unit is configured to perform a process of depositing a thin film on the substrate on a basis of a reaction between the reactant gas and the source gas absorbed onto the substrate in the second region, which is larger than the third region.

18. The apparatus of claim 1, wherein,
    the third gas distribution unit comprises:
    a first purge gas distribution unit configured to distribute a purge gas to the first zone of the third region;
    a first plasma distribution unit disposed in the first purge gas distribution unit, so that the purge gas, the plasma gas, and the purge gas is distributed to the substrate passing through the first zone;
    a second purge gas distribution unit configured to distribute a purge gas to the second zone of the third region;
    a second plasma distribution unit disposed in the second purge gas distribution unit, so that the purge gas, the plasma gas, and the purge gas is distributed to the substrate passing through the second zone; and
    a center purge distribution unit configured to distribute a purge gas to the third zone of the third region, and
    the third region is smaller than each of the first region and the second region.

* * * * *